United States Patent [19]

Yamaguchi et al.

[11] Patent Number: 4,996,659
[45] Date of Patent: Feb. 26, 1991

[54] METHOD OF DIAGNOSING INTEGRATED LOGIC CIRCUIT

[75] Inventors: Noboru Yamaguchi, Higashiyamato; Hideo Nakamura, Tokyo; Yoshimune Hagiwara; Tsukasa Sato, both of Hachioji; Haruo Koizumi, Tokyo, all of Japan

[73] Assignee: Hitachi, Ltd., Tokyo, Japan

[21] Appl. No.: 84,153

[22] Filed: Aug. 12, 1987

[30] Foreign Application Priority Data

Aug. 20, 1986 [JP] Japan ................... 61-192884
Sep. 19, 1986 [JP] Japan ................... 61-219169

[51] Int. Cl.⁵ ............................................ G01R 31/28
[52] U.S. Cl. ................................. 364/579; 364/578; 371/23
[58] Field of Search .................. 364/579, 580, 578; 371/23, 25, 26, 25; 324/73 R; 250/396 R, 492.21–492.23

[56] References Cited

U.S. PATENT DOCUMENTS

| | | | |
|---|---|---|---|
| 3,614,608 | 10/1971 | Giedd | 371/25 |
| 3,777,129 | 12/1973 | Mehta | 364/580 |
| 4,450,560 | 5/1984 | Conner | 371/25 |
| 4,613,970 | 9/1986 | Masuda et al. | 371/25 |
| 4,727,545 | 2/1988 | Glackemeyer et al. | 371/25 |
| 4,733,174 | 3/1988 | Crosby | 324/73 R |
| 4,733,176 | 3/1988 | Feuerbaum | 324/73 R |
| 4,761,607 | 8/1988 | Shiragasawa et al. | 324/73 R |
| 4,769,817 | 9/1988 | Krohn et al. | 371/25 |
| 4,773,028 | 9/1988 | Tallman | 364/578 |
| 4,791,357 | 12/1988 | Hyduke | 371/25 |
| 4,801,879 | 1/1989 | Spicer | 324/73 R |

OTHER PUBLICATIONS

Rossero, H. "Module Test with Computer Simulator and Random Pattern Generator", IBM Technical Disclosure Bulletin, vol. 25, No. 5, Oct. 1982, pp. 2385-2386.

Kuji et al., "A Fully-Automated Electron Beam Test System for VLSI Circuits" IEEE Design & Test 1985, pp. 74–82.

Chang et al., "Fault Diagnosis of Digital Systems" 1970, pp. 126–140.

*Primary Examiner*—Parshotam S. Lall
*Assistant Examiner*—Ellis B. Ramirez
*Attorney, Agent, or Firm*—Antonelli, Terry, Stout & Kraus

[57] ABSTRACT

A method of diagnosis of an integrated logic circuit having function blocks, in which a test signal is supplied to the logic circuit; an input signal to and an output signal from at least one of the function blocks are detected by the use of a contactless probing device such as an electron beam probing device or laser beam probing device; simulation is carried out of a normal logic operation of the function block with the detected input signal to provide a simulated output signal; the detected and simulated output signals are compared with each other; and the function block is determined as being normal or abnormal according to the result of the comparison. When the function block includes plural logic elements, the cause of the abnormality may be traced back to a faulty function element by detecting the output of a function element by a contactless probing device, comparing the detected output with a corresponding simulated output and repeating the detection and comparison on other function elements in the function block until the comparison results in coincidence. The function element which receives the signal providing the coincidence as a result of the comparison is determined as the faulty function element.

6 Claims, 9 Drawing Sheets

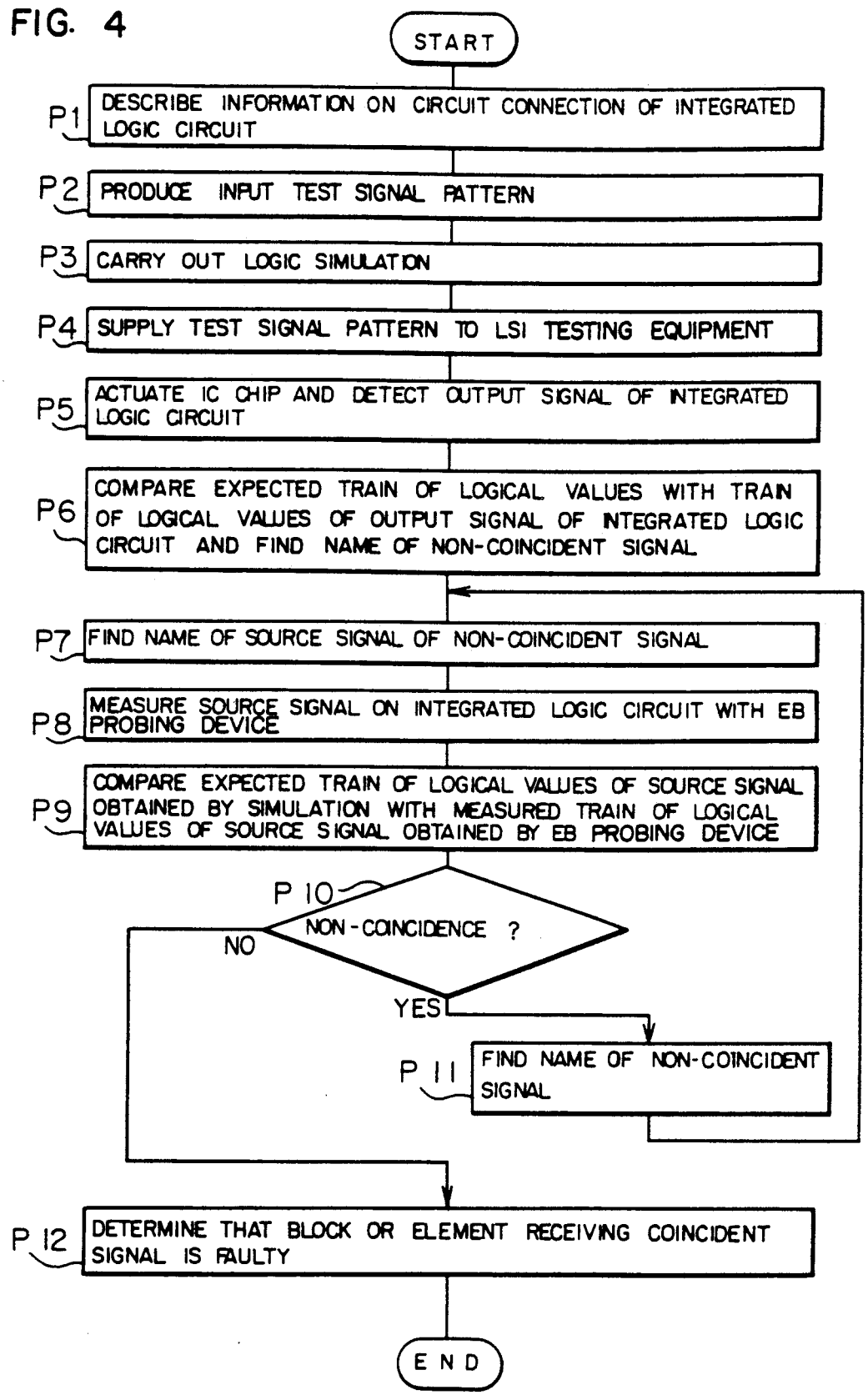

A,B,C ---- NAMES OF INPUT SIGNALS
X,Y ---- NAMES OF OUTPUT SIGNALS
D,E,F ---- NAMES OF INTERNAL SIGNALS
G - G ---- NAMES OF GATES

| NAME OF GATE | KIND OF ELEMENT | NAME OF SOURCE SIGNAL ; NAME OF INPUT SIGNAL |
|---|---|---|

| NAME OF GATE | KIND OF ELEMENT | NAME OF SOURCE SIGNAL ; NAME OF INPUT SIGNAL |
|---|---|---|
| G 1 | N A N D | D ; A , B |
| G 2 | I N V | E ; D |
| G 3 | N A N D | F ; B , C |
| G 4 | N A N D | X ; E , F |
| G 5 | I N V | Y ; F |

| A | 1 | 0 | 0 | 1 | 0 | 1 | ... |
|---|---|---|---|---|---|---|---|
| B | 0 | 1 | 0 | 1 | 1 | 1 | ... |
| C | 0 | 0 | 1 | 0 | 1 | 0 | ... |

| D | 1 | 1 | 1 | 0 | 1 | 0 | ... |
|---|---|---|---|---|---|---|---|
| E | 0 | 0 | 0 | 1 | 0 | 1 | ... |
| F | 1 | 1 | 1 | 1 | 0 | 1 | ... |
| X | 1 | 1 | 1 | 0 | 1 | 0 | ... |
| Y | 0 | 0 | 0 | 0 | 1 | 0 | ... |

| A | 1 | 0 | 0 | 1 | 0 | 1 | ... |
|---|---|---|---|---|---|---|---|
| B | 0 | 1 | 0 | 1 | 1 | 1 | ... |
| D | 0 | 0 | 0 | 0 | 0 | 0 | ... |
| E | 1 | 1 | 1 | 1 | 1 | 1 | ... |
| F | 1 | 1 | 1 | 1 | 0 | 1 | ... |
| X | 0 | 0 | 0 | 1 | 0 | 1 | ... |
| Y | 0 | 0 | 0 | 0 | 1 | 0 | ... |

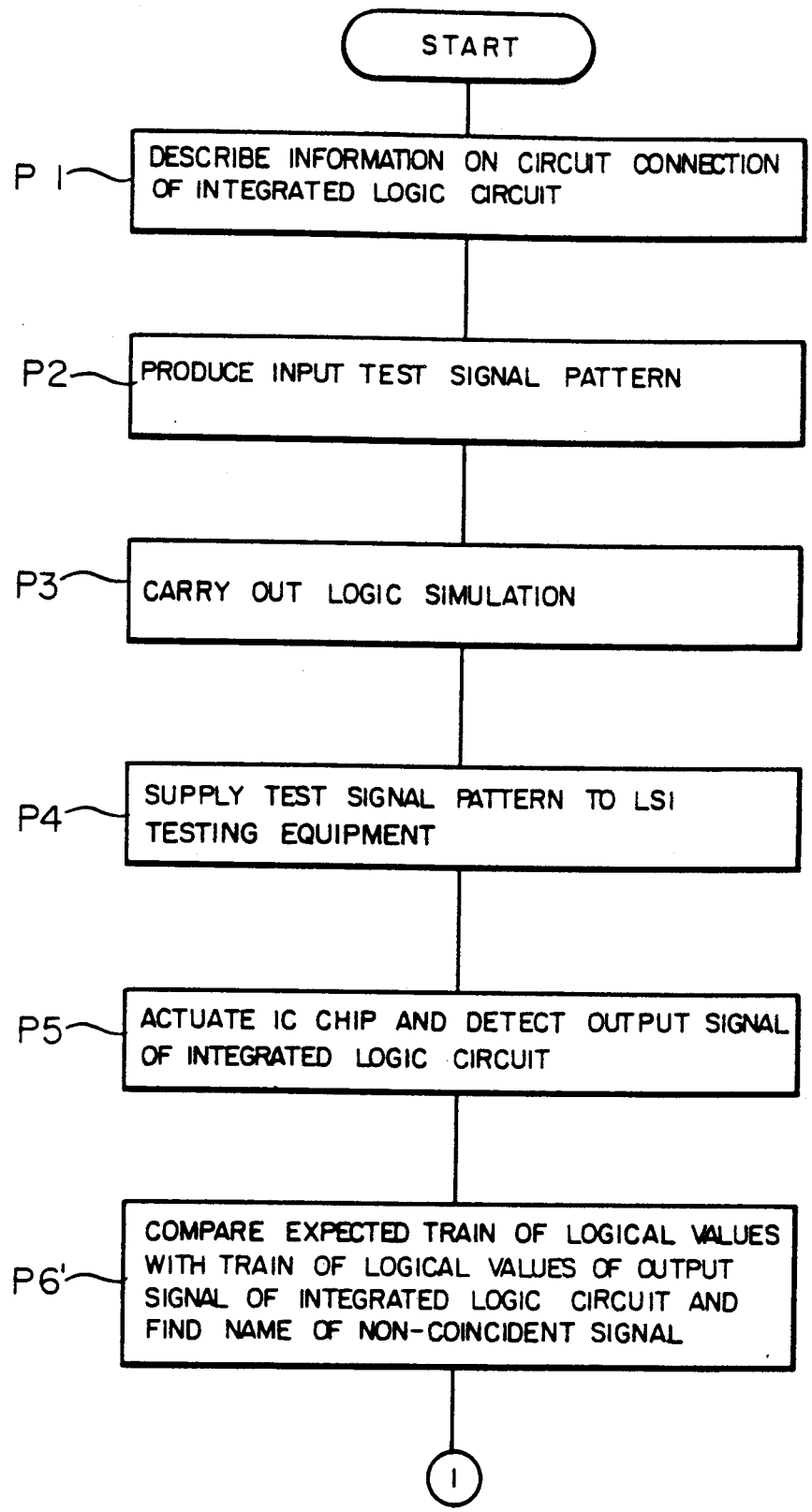

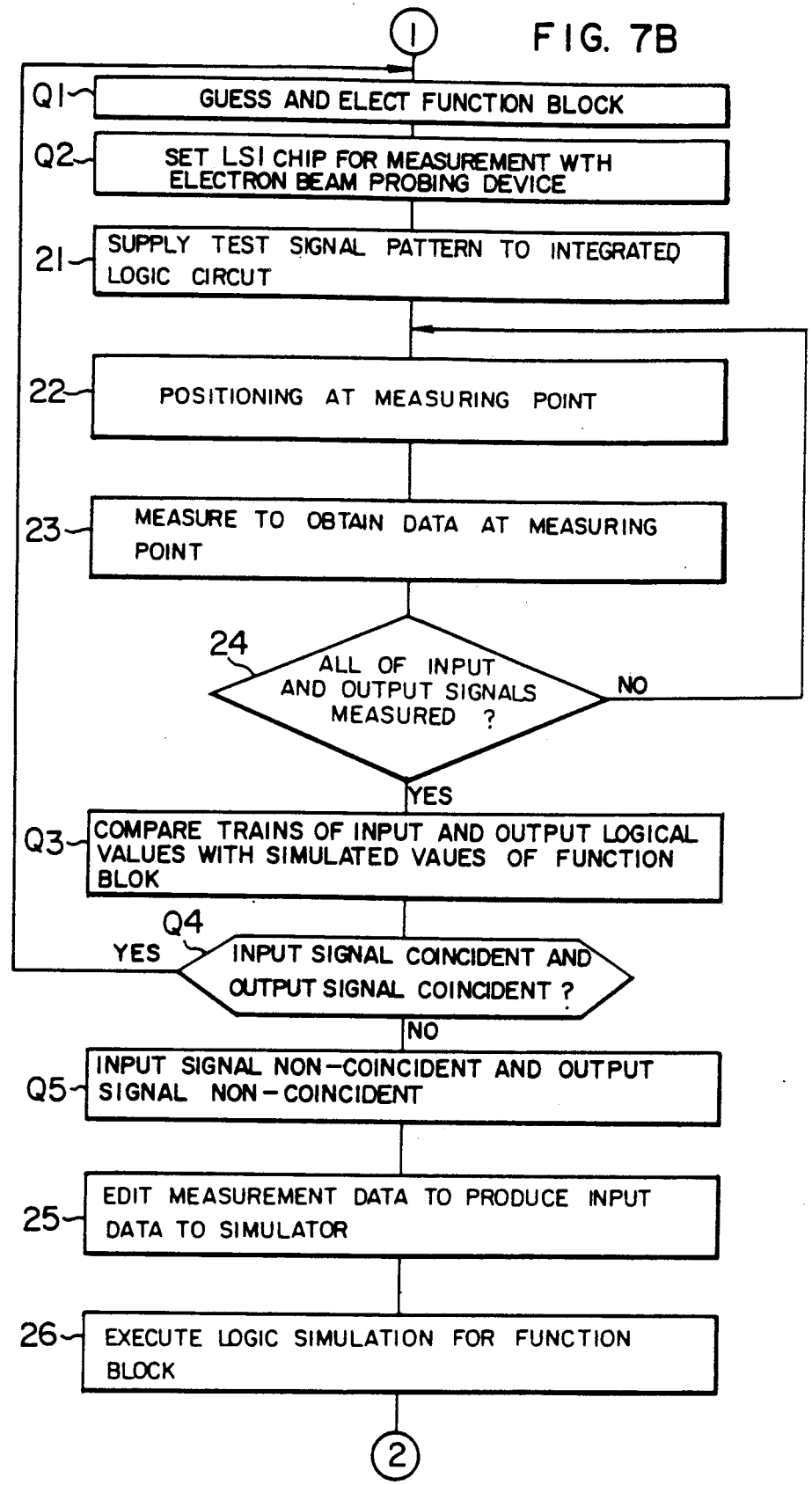

METHOD OF DIAGNOSING INTEGRATED LOGIC CIRCUIT

BACKGROUND OF THE INVENTION

The present invention relates to a method of diagnosing an integrated logic circuit, especially a logic circuit implemented in the form of a large scale integrated circuit, and in particular to a method of diagnosing a logic circuit by using contactless probing techniques.

As a method of diagnosing a logic circuit, there is a method using a fault dictionary as described in "Fault Diagnosis of Digital Systems", H.Y. Chang et al., 1970, pp. 126 to 140, John Wiley & Sons, Inc., for example.

When abnormality is found in a signal at a certain point of a logical circuit to be diagnosed, it is possible to know which point of the circuit causes that abnormality by referring to a list made beforehand by means of simulation or the like. This list is a fault dictionary.

However, the time required for the fault simulation for making this fault dictionary increases in proportion to the number of elements to the 2nd or 3rd power. Thus, as the logic circuit is implemented in a large scale integrated circuit and the scale of the logic circuit is increased, therefore, the simulation for the fault diagnosis needs an extremely long time. Further, the fault dictionary itself needs a large memory capacity.

As described above, the fault diagnosis of an integrated logic circuit has now become extremely difficult as the number of integrated components is increased.

As one potent method for solving the above described problem, contactless probing techniques have been developed. In accordance with these techniques, the signal potential within an element is measured by using an electron beam or a laser beam.

One of the above described techniques is described in IEEE, "Design & Test of Computers", Vol. 2, No. 5, Oct. 1985, pp. 74 to 82.

In accordance with the technique described in "Design & Test of Computers", the logic operation of the measured integrated circuit is held at a certain time point, and the chip surface of the integrated circuit at that time point is observed by using a stroboscopic scanning electron microscope (stroboscopic SEM).

The SEM image provides a wiring pattern image of the top layer depending upon the logic state of the integrated circuit at that time point. For example, a wiring pattern of logic "0" is bright and visible, and a wiring pattern of logic "1" is dark and invisible. As a result, it is possible to obtain a wiring pattern image depending upon the logic state of the integrated circuit.

Subsequently, the above described pattern image actually obtained is compared with an expected wiring pattern image reproduced on the basis of the logic simulation and mask pattern data. The fault diagnosis can thus be effected.

As described above, the method using a fault dictionary has problems that the fault simulation needs an extremely long time as the logic circuit scale is increased and the fault dictionary itself needs a large memory capacity.

Further, the above described method using a conventional contactless testing equipment has a problem that faulty logic operation relating to timing such as the delay time or hazards cannot be detected because the logic operation must be held at a certain time point for the detection. Further, both the time required for the logic simulation and the time required for reproducing the expected wiring pattern image become extremely long as the scale of the integrated circuit is increased. This results in a problem of very long fault diagnosis time.

SUMMARY OF THE INVENTION

An object of the present invention is to provide a method of diagnosing an integrated logic circuit which makes it possible to detect faulty operation related to timing, which requires a short time for the simulation or the like, and which makes it possible to carry out the fault diagnosis accurately within a short time.

In accordance with one aspect of the present invention, the fault diagnosis of integrated logic circuits is carried out as follows. A test signal is supplied to an integrated logic circuit, and input signals and output signals of function blocks included in the integrated logic circuit are detected by the use of a contactless probing device. The term "function block" denotes a component or a combination of circuit components capable of performing a logic function. As the above described contactless probing device, an electron beam testing device or a laser beam testing device or any other equivalent devices may be used. By applying an electron beam or a laser beam onto a specific signal line in the above described function block, a change of the signal at that portion with time is measured. Subsequently, logic simulation is carried out by using the input signal detected with the above described contactless probing device as the input data to the logic simulation preset for a normal function of the above described function block. Subsequently, the output signal obtained by the above described logic simulation is compared with an output signal obtained by using the above described contactless testing device. By analyzing the non-coincidence data obtained by this comparison, the fault analysis is performed.

Since the electron beam or the laser beam is so radiated as to be focused to a specific point as described above, it is possible to easily obtain the change of the signal at that portion with time.

Further, the logic simulation need not be performed for the entire integrated circuit, but need be performed only for a function block to be inspected such as a function block in which a fault is expected to have occurred. Accordingly, only a small portion of the logic circuit need be inspected. As a result, the time required for diagnosis is shortened. Further, it is also unnecessary to reproduce the expected wiring pattern image from the result of the logic simulation and the mask pattern data. From this point as well, the fault diagnosis can be performed easily and in a short time.

In accordance with another aspect of the present invention, the fault diagnosis of the integrated logic circuit is performed as follows.

At first, a test signal is supplied to the input terminal of a logic circuit to be diagnosed. The signal at the output terminal of the logic circuit to be diagnosed or the output signal at a predetermined measuring point within the above described logic circuit to be diagnosed is detected. The above described signal at the output terminal is detected by using an LSI testing equipment. The signal at the predetermined measuring point within the logic circuit is detected by using a contactless detecting device. As the above described contactless testing device, an electron beam testing device or a laser beam testing device, for example, may be used. And an electron beam or a laser beam is applied onto a specific signal line of a function block or a logic component in the above described logic circuit to be diagnosed. The change of the signal at such a portion with time is measured.

Subsequently, the output signal at the above described output terminal or the above described predetermined measuring point derived by the logic simulation of the above described logic circuit, i.e., the expected output signal is compared with the above described output signal actually detected. A signal produced by faulty operation is thus detected. That is to say, an output signal which does not coincide with the expected output signal is a faulty signal.

Subsequently, an input signal to the above described function block or logic element producing a faulty output signal, i.e., a source signal is derived by referring to a file of logic connection information.

Subsequently, the position of the above described source signal, i.e., the position of the input signal to a function block or a logic element producing a faulty output signal is determined to be a measuring point. Under the state that the above described test signal is supplied to the circuit to be diagnosed, the output signal at that measuring point is detected by a contactless testing device.

Subsequently, the output signal derived by the logic simulation at that measuring point, i.e., the expected output signal corresponding to the source signal is compared with the output signal corresponding to the aforementioned source signal detected. A signal produced by faulty operation is thus detected.

The above described processing is repeated to detect a function block or a logic element or component whose output signal is faulty and whose input signal is not faulty.

If the output signal of a circuit portion is faulty even with a normal or correct input signal applied thereto as described above, it can be determined that the circuit portion is faulty. By determining that the function block or logic component is faulty, therefore, the fault diagnosis can be performed.

Since the electron beam or the laser beam is so radiated as to be focused onto a specific point, the change of the signal of that portion with time can be easily measured. Since the operation of the logic circuit need not be held for the purpose of measurement, faulty operation of the logic relating to the timing such as the delay of the circuit or hazards can also be detected.

Further, a source signal is derived only for a faulty signal, i.e., a signal whose expected output signal does not coincide with the actually detected output signal. And only the path of a faulty signal, i.e., only the path expected to be faulty is traced back to perform diagnosis. As compared with a case where the entire large scale integrated circuit is inspected, therefore, the diagnosis can be performed easily and in a short time.

Further, the extremely long computation time can be saved since the fault dictionary need not be made. This also makes it possible to perform the fault diagnosis with ease and in a short time.

BRIEF DESCRIPTION OF THE DRAWING

FIG. 4 shows processing steps in another embodiment of the diagnosis method according to the present invention.

FIGS. 7A to 7C show processing steps in another embodiment of the present invention.

DESCRIPTION OF THE PREFERRED EMBODIMENTS

Figure 1:
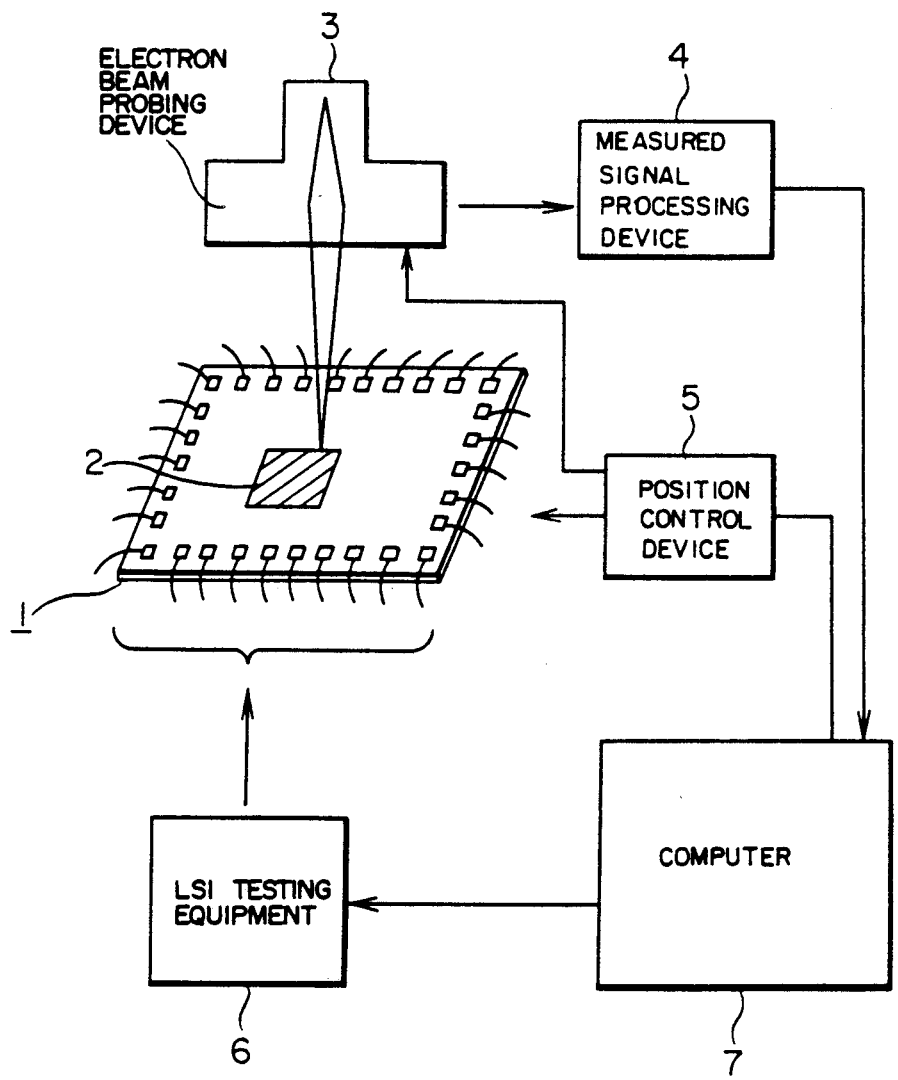
FIG. 1 is a block diagram showing an example of the whole configuration of an apparatus for carrying out a fault diagnosis according to the present invention.

FIG. 1 shows an example of the whole configuration of an apparatus which can be used in an embodiment of the fault diagnosis method according to the present invention.

In FIG. 1, numeral 1 denotes a chip of integrated logic circuit to be observed. The chip 1 includes a function block 2 capable of performing a logic function. It is now assumed that the fault diagnosis is desired to be performed of the function block 2.

An electron beam probing device 3 applies an electron beam to a measuring point and detects the amount of secondary electrons generated there to measure the signal potential of that portion.

A measured signal processing device 4 converts the waveform data of the measuring point obtained by the electron beam probing device 3 to logic information "0" or "1". The conversion timing is represented by a phase difference with respect to a basis clock used when a test signal pattern (which will be described later) is supplied to the chip 2. And the conversion timing is generally directed by a computer 7 which will be described later. The computer 7 may be, for example, replaced by an engineering work station provided with a 32-bit microprocessor.

A position control device 5 is a device for defining the measuring point for the electron beam probing device 3. For defining the position whereto the electron beam is applied, the position control device 5 determines the amount of movement of a sample stand (not illustrated) supporting the chip 2 and the beam deflection angle and transmits them to the electron beam probing device 3. The amount of movement at this time is a relative movement for moving the sample stand. The measuring position is usually given in the form of absolute coordinates derived from mask pattern data existing in the computer 7. Therefore, it can be said that the position control device 5 determines the relative amount of movement from the absolute coordinates.

For performing the conversion between the absolute coordinates and the amount of relative movement, the coordinate system of the mask pattern data must be related with the coordinate system of the sample stand beforehand. This relation must be made manually. In the position control device 5, therefore, control knobs (not illustrated) for moving the sample stand in X and Y directions are provided. The above-mentioned relation is established with respect to at least three selected points.

An LSI testing equipment 6 serves to supply a test signal pattern for operating the integrated logic circuit chip 1 to be measured in accordance with the basic clock. The LSI testing equipment 6 has a test signal pattern memory and timing control information therein and sends out data stored in the test pattern memory in accordance with the timing control information. This output signal is applied to the integrated logic circuit 1 to be tested and measured. The LSI testing equipment 6 also detects the signal at the output terminal of the circuit 1. The data in the test signal pattern memory is what is generated by the computer 7 and sent to the LSI testing equipment 6 through a magnetic tape or a communication line.

The computer 7 stores therein the mask pattern information and the logic connection information of the integrated logic circuit chip 1 to be measured. Further, the computer 7 has programs for determining the position coordinates of the signal line and a logic simulator.

Figure 2:
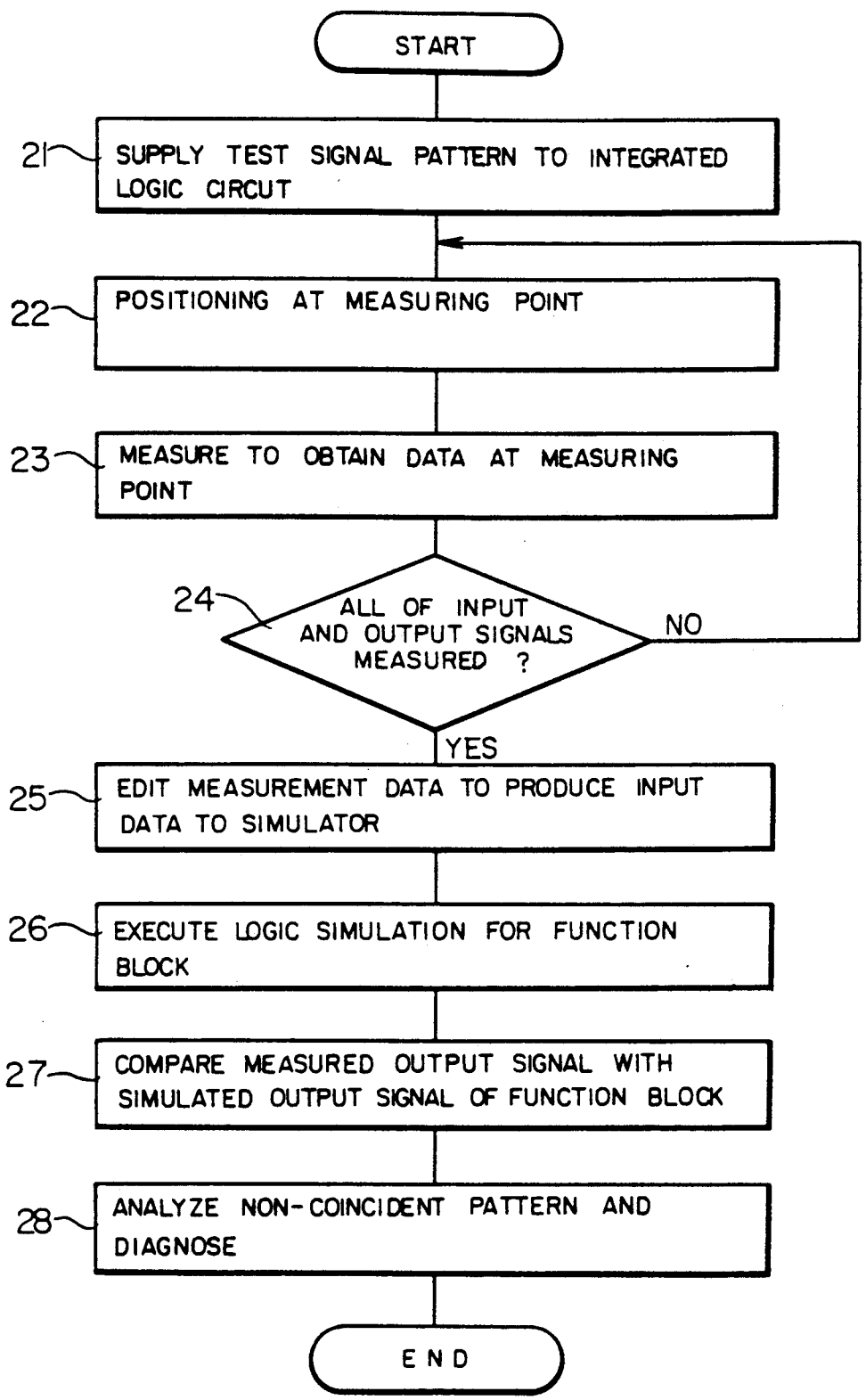
FIG. 2 shows the processing steps in an embodiment of the fault diagnosis method according to the present invention.

FIG. 2 shows the processing steps in an embodiment of fault diagnosis using the apparatus of FIG. 1.

At first, the test signal pattern for operating the integrated logic circuit 1 to be measured is set in the LSI testing equipment 6 at step 21 of FIG. 2. In general, this pattern is generated beforehand by a logic simulator such as the computer 7. And the LSI testing equipment 6 is activated to supply the test signal pattern to the integrated logic circuit 1 to be measured. In response to this test signal pattern, the integrated logic circuit 1 to be measured starts its operation.

At step 22, a function block to be diagnosed such as the function block 2 supposed to be faulty is selected, and the coordinates of the point where one signal of its input or output is derived is determined by the computer 7. The information on the coordinates is sent to the position control device 5 to focus the electron beam of the electron beam probing device 3 onto the position of the signal to be measured.

At step 23, the electron beam probing device 3 detects the amount of secondary electrons generated at the measuring point to reproduce a temporal waveform (a time sequence or a train of logic levels) of the signal levels at the measuring point. The reproduced waveform is converted to a train of logic levels by the measured signal processing device 4 and transmitted to the computer 7.

The above described processing steps are performed for all of the input signals and the output signals of the function block to be measured. At step 24, it is judged whether all of the above described measurements have been finished or not. Unless finished, the processing is returned to the step 22. The loop is repeated until all measurements are finished.

Subsequently, at step 25, the input data of the logic simulation of the function block 2 are edited by using the input signal of this function block obtained by the electron beam probing device 3.

Subsequently, at step 26, logic simulation of the function block is carried out on the basis of the above described input data.

The logic simulation at the step 26 will now be described.

The computer 7 has the following information data stored therein:

(1) logic circuits of the inspected function block in terms of the logic description language for the simulation,
(2) trains of logical values ("0" and "1") to be supplied to the inspected function block,
(3) trains of logical values to be derived from the inspected function block, and
(4) logic simulation program.

The data described in (2) and (3) are obtained by measurement using the electron beam probing device.

In the logic simulation at the step 26, the logic simulation program described in (4) is activated with the input signal described in (2) and the circuit description described in (1) adopted as the input. That is to say, the circuit referred to in (1) is operated with the input signal of (2) simultaneously on the computer.

As a result of this simulation run, a train of logical values of the output signal from the circuit described in (1) can be obtained.

Subsequently, at step 27, the measurement data of the output signal obtained at the step 23 is compared with the simulated output signal obtained at the step 26.

Subsequently, at step 28, the non-coincident test signal pattern in the above described comparison result is analyzed to perform the fault diagnosis.

The coincidence in all of the above described comparison results means non-existence of faults.

If the circuit scale of the function block to be diagnosed is large at step 28, the function block may be divided into a plurality of sub-blocks and the above described processing steps 21 to 28 may be performed for the sub-blocks into which the block is divided. Since in this case the fault diagnosis can be performed for respective small sized circuits, the fault diagnosis is facilitated.

According to the above-described embodiment, the operation of the integrated logic circuit need not be held for the purpose of measurement, fault operation of the logic relating to timing such as the delay time of the circuit and hazards can also be detected. Further, it is also unnecessary to obtain the expected pattern of wiring pattern image. Further, the logic simulation and the fault diagnosis can be performed for respective small function blocks. Accordingly, the fault diagnosis can be performed only for a function block needing the fault diagnosis such as a function block expected to be faulty. As a result, the fault diagnosis time becomes very short. And, it becomes possible to accurately determine which portion of the integrated logic circuit is faulty.

An example of the function blocks for performing the function required for the fault diagnosis of the computer 7 shown in FIG. 1 will now be described by referring to FIG. 3. The function blocks shown in FIG. 3 is mainly related to the embodiment shown in FIG. 4 later described.

Figure 3:
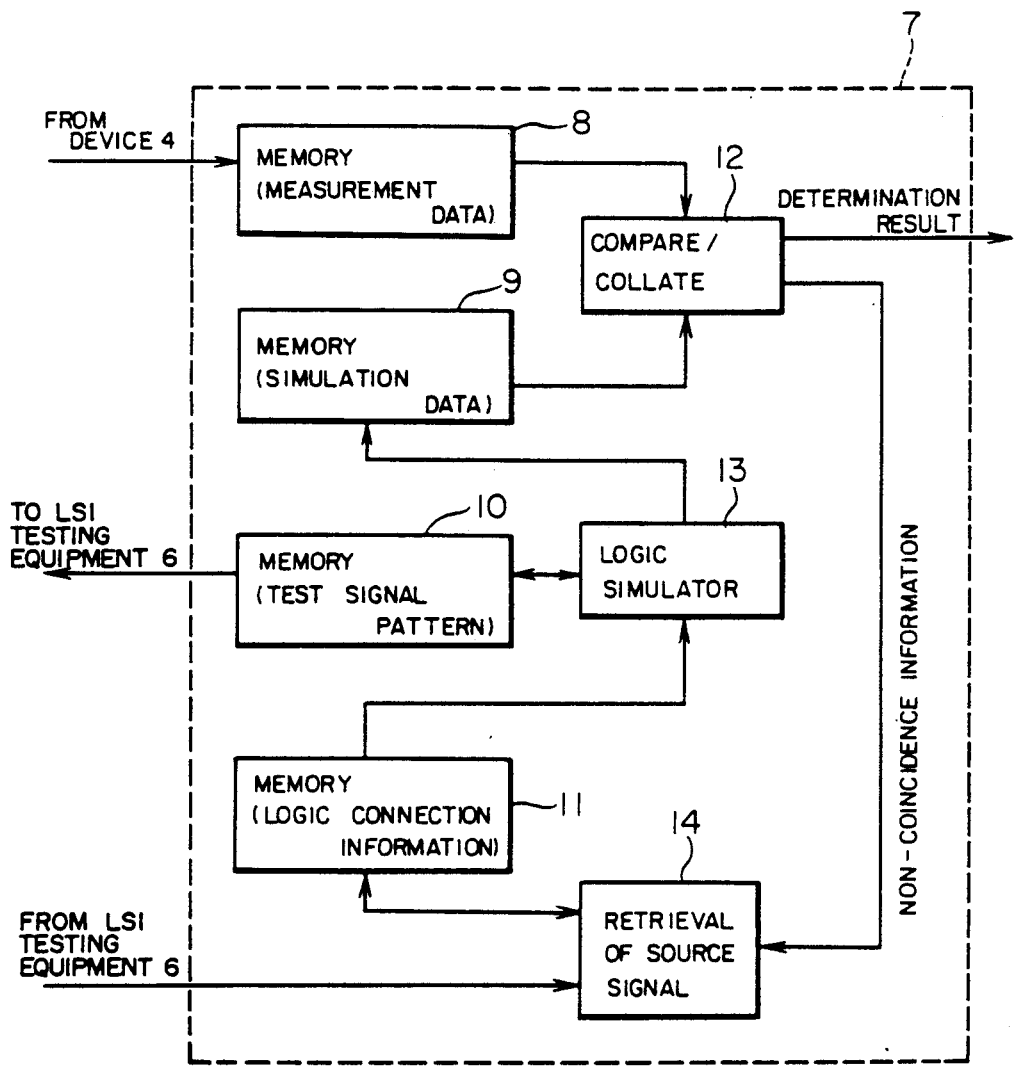
FIG. 3 is a block diagram for illustrating a part of the function of a computer 7 shown in FIG. 1.

In FIG. 3, measurement data supplied from the measured signal processing device 4 shown in FIG. 1 are stored in memory 8. The memory is a main memory or a secondary memory such as a disk. This holds true in the following description of memories.

The logic connection information of the logic circuit 1 to be diagnosed is beforehand stored in a memory 11 of the computer 7. In addition, a train of logical values of the input test signal (test signal pattern) for operating the logic circuit 1 to be diagnosed is beforehand stored in a memory 10.

On the basis of the contents of the above described two memories 10 and 11, logic simulator program 13 is executed to obtain the simulated values of a train of logical values (change of the signal with time), i.e., a train of expected logical values of the signal appearing at the output terminal of the diagnosed logic circuit 1 or of an output signal appearing at a predetermined position within the diagnosed logic circuit 1.

Among the expected train of logical values obtained as described above, those relating to the signal at the output terminal are stored into the memory 10 as a part of the test signal pattern. And those relating to a signal within the logic circuit are stored into the memory 9 together with a code representing its signal name as the simulated data of the logic circuit to be diagnosed.

With respect to the signals at the same measuring point, collation/discrimination program 12 compares the measured data stored in the memory 8 with simulated data stored in the memory 9.

Upon non-coincidence, the collation/discrimination program 12 reports its signal name to source signal retrieval program 14.

The source signal retrieval program 14 receives the report of the signal name from the collation/discrimination program 12 or the LSI tester 6 shown in FIG. 1 and derives the source signal name of that signal by retrieving the logic connection information of the memory 11.

The LSI testing equipment 6 shown in FIG. 1 receives the test signal pattern from the computer 7 and converts it into an electric signal to supply it to the diagnosed logic circuit 1 as the input. Further, the LSI testing equpment 6 measures the signal at the output terminal of the diagnosed logic circuit 1 and compares the train of logical values with the expected train of logical values at the output terminal prepared beforehand by the logic simulator program 13. Upon the non-coincidence signal, the LSI testing equipment 6 reports its name to the source signal retrieval program 14.

FIG. 4 shows a flow chart illustrating the processing steps for performing the fault diagnosis according to another embodiment of the present invention in the apparatus shown in FIGS. 1 and 3.

In FIG. 4, the logic connection information of the diagnosed logic circuit 1 is described in the memory 11 of the computer at step P1. That is to say, the logic circuit which is completely the same as that implemented on the integrated logic circuit chip is implemented on the computer 7.

Subsequently, at step P2, the test signal pattern for operating the logic circuit 1 to be diagnosed is produced. This may be produced manually or may be produced automatically by the computer.

Subsequently, at step P3, logic simulation is executed in the logic simulator 13 of the computer 7 on the basis of the test signal pattern and logic connection information produced at the step P2, and simulated values of the signal at the output terminal of the logic circuit and simulated values of signal within the logic circuit are prepared.

Subsequently, at step P4, the test pattern produced at step P2 and the signal at the output terminal derived at step P3 (a train of expected logical values of the output signal) are supplied to the LSI testing equipment. The supply may be by an offline method using a magnetic tape or the like or by an online method using a communication line or the like.

Subsequently, at step P5, the test signal pattern produced at the step P2 is supplied from the LSI testing equipment 6 to the diagnosed logic circuit 1 to actuate it. From the output terminal of the circuit 1, the LSI testing equipment 6 acquires the response signal pattern responsive to the input test signal pattern.

Subsequently, at step P6, the signal at the output terminal of the diagnosed logic circuit 1 obtained at the step P5 is compared with the simulated values of the output signal derived at the step P3, and a non-coincident signal is detected. Since the fault diagnosis is performed when some abnormality is supposed to exist, a non-coincident signal is generally found at least at one terminal at this step.

Subsequently, at step P7, a source signal of a non-coincident signal, i.e., the input signal name of a function block or a logic element outputting the non-coincident signal is found. The above described source signal is found by referring to the file of the logic connection information within the memory 11 of the computer 7.

Subsequently, at step P8, the same test signal pattern as that of the step P5 is supplied to the diagnosed logic circuit 1 to activate it by using the LSI testing equipment 6 again. And a train of logic values of the signal at a predetermined position within the diagnosed logic circuit 1, i.e., the above described source signal is measured with the electron beam probing device 3.

Subsequently, at step P9, the measured source signal is compared with the simulated source signal stored in the memory 9.

Subsequently, at step P10, it is determined by the collation/discrimination program 12 whether a non-coincident signal is present or not as a result of comparison between the measured value and the simulated value.

If the result of the comparison in the step P10 is "YES", i.e., if a non-coincident signal is found, the source signal of that non-coincident signal is found at step P11, and the step P7 is resumed to repeat the above described processing steps (P7 to P9). So long as a non-coincident signal is found, therefore, the processing steps for finding the source signal of the non-coincident signal and performing the comparison are repeated.

If the result of the comparison in the step P10 is "NO", i.e., if a non-coincident signal is not found, it is determined at step P12 that a function block or a logic element eventually providing a non-coincident signal is faulty. That is to say, since the output signal of the function block or element is faulty though its input signal is not faulty, this means that the function block or the logic element is faulty.

A further embodiment of the diagnosis method will now be described in detail by referring to an example of an actual logic circuit.

Figures 5A, 5B, 5C, 5D, 5E, 5F:
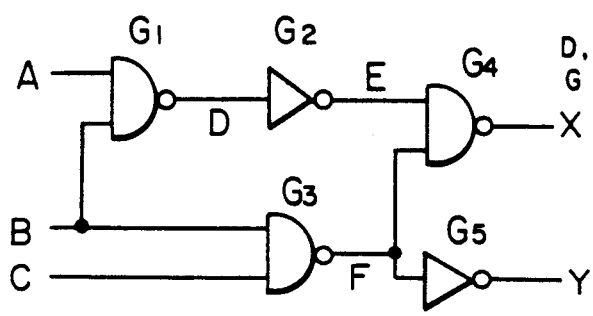
FIG. 5A is a circuit configuration diagram of a function block to be diagnosed.
FIG. 5B shows a format for describing the logic circuit connection information.
FIG. 5C shows a file of the circuit connection information of the function block shown in FIG. 5A described in accordance with the above described format.
FIG. 5D shows an example of an input test signal pattern.
FIG. 5E shows simulated values of the function block of FIG. 5A under the state that the input of FIG. 5D is supplied thereto.
FIG. 5F shows an example of measured data of the function block shown in FIG. 5A obtained when the input of FIG. 5D is supplied thereto.

FIG. 5A shows an example of a configuration of a function block in the actual logic circuit. FIG. 5B shows a format of circuit description of the logic connection information shown in 11 of FIG. 3. FIG. 5C shows a file of circuit connection information of the function clock illustrated in FIG. 5A which is described in accordance with the above described format and stored in the memory 11. FIG. 5D shows an example of the input test signal pattern stored in the memory 10 of FIG. 3. FIG. 5E shows simulated values of the function block of FIG. 5A supplied with the input of FIG. 5D. FIG. 5F shows an example of actual measured values of the function block illustrated in FIG. 5A under the condition that it is supplied with the input of FIG. 5D.

The train of logical values shown in FIG. 5F is the data measured in case of such a fault that the signal D becomes always 0 (in case the logic element $G_1$ is short-circuited to the GND, for example).

Figure 6:
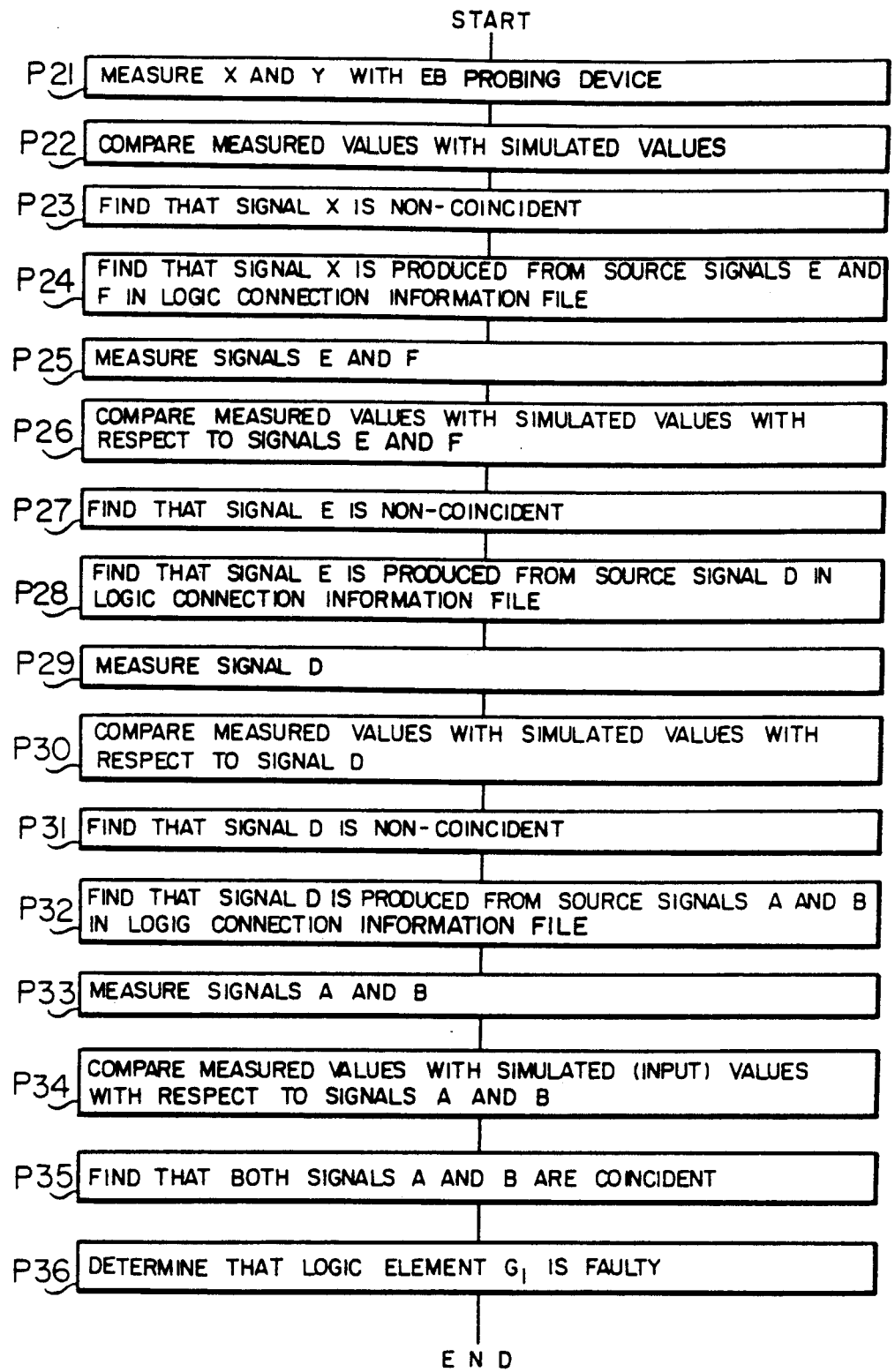
FIG. 6 shows processing steps in case the function block of FIG. 5A is diagnosed in accordance with the processing illustrated in FIG. 4.

FIG. 6 shows the processing steps for diagnosing the function block of FIG. 5A in accordance with the above described processing steps of FIG. 4.

At first, the signals X and Y at the output terminals of FIG. 5A are measured with an electron beam probing device at step P21 of FIG. 6. As a result, trains of logical values X and Y shown in FIG. 5F are obtained.

Subsequently at step P22, simulated values of X and Y shown in FIG. 5E and prepared beforehand are compared with the above described measured values of X and Y by the collation/discrimination program 12 of the computer 7.

As a result of the above described comparison, it is found that the signal X is non-coincident as represented by step P23.

Subsequently, at step P24, it is found that the source signals of the signal X are signals E and F by referring to the file of the circuit description information shown in FIG. 5C.

Subsequently, at step P25, signals E and F are measured with an electron beam probing device. As a result, trains of logical values of E and F shown in FIG. 5F are obtained.

Subsequently, at step P26, simulated values of E and F of FIG. 5E prepared beforehand are compared with the above described measured values of E and F by the collation/discrimination program 12 of the computer 7.

As a result of the above described comparison, it is found that the signal E is non-coincident as represented by step P27.

Subsequently, at step P28, it is found that the source signal of the signal E is the signal D by referring to the file of the circuit description information shown in FIG. 5C.

Subsequently, at step P29, the signal D is measured with an electron beam probing device. As a result, the train of logical values of D shown in FIG. 5F is obtained.

Subsequently, at step P30, the simulated value of D of FIG. 5E prepared beforehand is compared with the above described measured value of D by the collation/discrimination program 12 of the computer 7.

As a result of the above described comparison, it is found that the signal D is non-coincident as represented by step P31.

Subsequently, at step P32, it is found that the source signal of the signal D is the signals A and B by referring to the file of the circuit description information shown in FIG. 5C.

Subsequently, at step P33, the signals A and B are measured. As a result, the trains of logical values of A and B shown in FIG. 5F are obtained.

Subsequently, at step P34, the simulated values of A and B of FIG. 5E prepared beforehand (input values in this case) are compared with the above described measured values of A and B.

As a result, it is found that both signals A and B are not non-coincident as represented by step P35.

As described above, the signals A and B are not faulty, and the signal D is faulty. Therefore, it is determined that the logic element $G_1$ having the signals A and B as its input signal and having the signal D as its output signal is faulty.

When the diagnosis method of the present invention is applied, the efficiency of diagnosis is raised by performing diagnosis while taking each of the function blocks or each of the function sub-blocks or function elements into which each block may be divided as the unit.

If a faulty function block (or a faulty unit) is detected as described above and thereafter diagnosis is performed for each function sub-block or each logic element in that block (or unit), the diagnosis with logic element taken as unit can be performed efficiently.

According to this embodiment, an electron beam or a laser beam is so radiated as to be focused onto a specific point. As a result, the change of the signal at that portion with time can be easily obtained. Further, it is not necessary to hold the operation of the logic circuit for the purpose of measurement. As a result, it is also possible to detect faulty operation of logic relating to timing such as the delay time of the circuit or hazards.

Further, the source signal is derived only for a faulty signal, i.e., only for a signal whose expected trains of logical values do not coincide with actually detected trains of logical values of the signal. And, only the path of a faulty signal, i.e., only the path expected to be faulty is traced back for performing the diagnosis. As a result, it is possible to perform the diagnosis with ease and in a short time as compared with the inspection of the whole large scale integrated circuit.

Further, it is not necessary to make a fault dictionary. As a result, an extremely long computation time can be saved. From this point as well, the fault diagnosis can be performed with ease and in a short time.

Figure 7C:
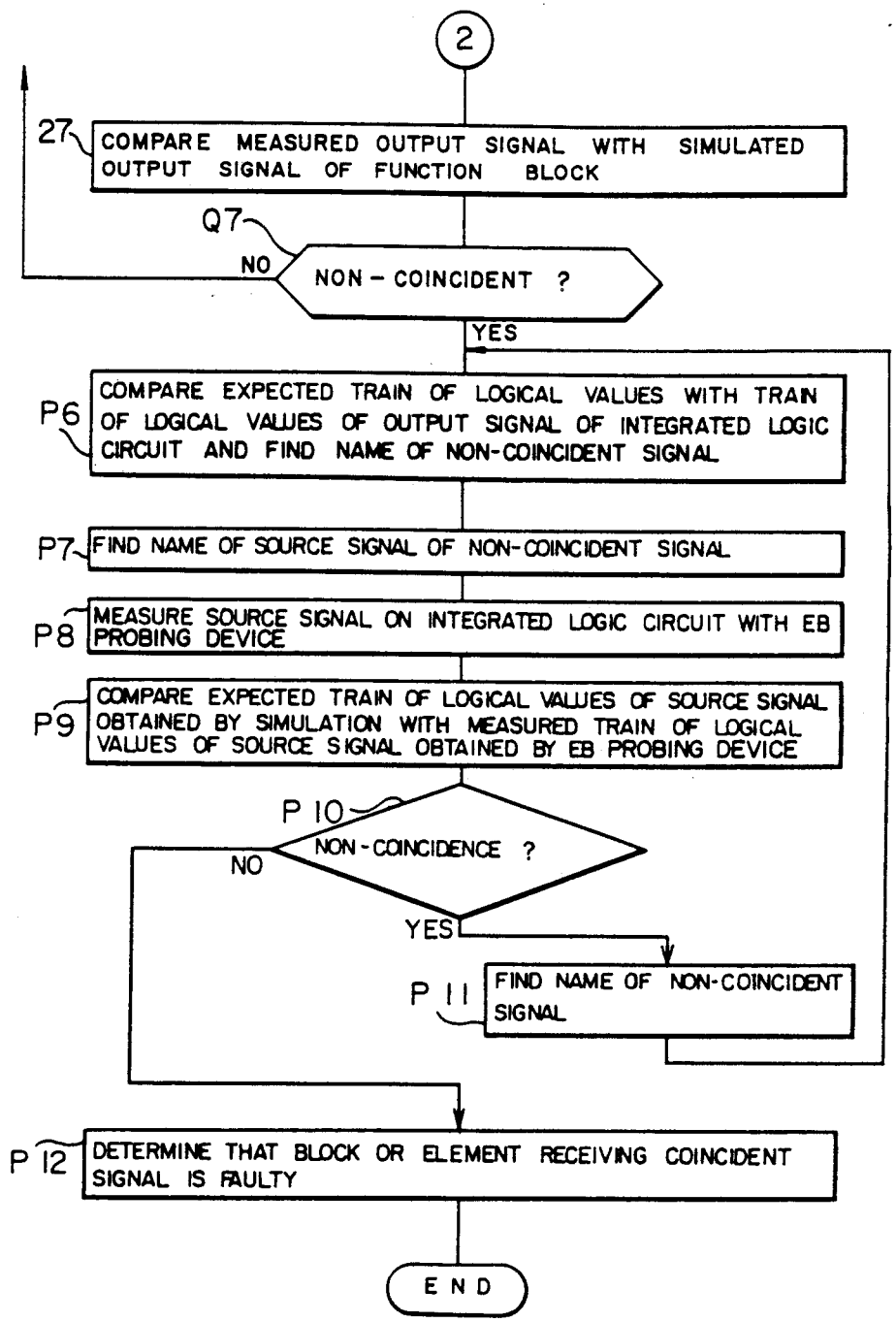

A modified embodiment of the present invention will now be described by referring to FIG. 7. This embodiment is advantageous especially in the fault diagnosis of a large scale integrated logic circuit. Processing steps P1 to P5 and P6 to P12 are the same as the processing steps P1 to P5 and P6 to P12 of the embodiment of FIG. 4. And processing steps 21 to 24 and 25 to 27 are the same as the processing steps 21 to 24 and 25 to 27 of the embodiment of FIG. 2.

At first, it is found at steps P1 to P6' that an LSI chip is faulty. At step P6', the same processing as the step P6 is performed. In the steps P1 to P6', the electron beam probing device is not used.

At step Q1, a function block supposed to be faulty (abnormal) is selected on the basis of the signal at a terminal causing non-coincidence and the timing relation.

At step Q2, the LSI chip is so positioned as to be measured with an electron beam probing device.

Subsequently, at steps 21 to 24, the input signal and the output signal of the elected function block are measured with an electron beam probing device.

At step Q3, trains of input and output logical values of the elected (measured) function block are compared with the corresponding simulated values.

If both the input and output signals are not faulty (i.e., if non-coincidence is not found) at step Q4, the elected function block is normal. As a result, another function block to be measured is guessed and elected at the step Q1.

If both the input and output signals are faulty (non-coincident) at the step Q4, the elected (measured) function block undergoes the measurement, simulation and comparison at steps 25 to 27. At step Q7, it is judged whether the function block is faulty (non-coincident) on the basis of the comparison between the measured output values and the simulated output values.

If any fault (non-coincidence) is not found as a result of judgment at the step Q7, this function block is normal and hence the step Q1 is restated.

If some fault (non-coincidence) is found as a result of judgment at the step Q7, there is a possibility that this function block is abnormal and hence the constituent elements of this function block undergo the fault diagnosis at steps P6 to P12.

We claim:

1. A method of diagnosing an integrated logic circuit, comprising the steps of:
   detecting a train of logical values of an input signal supplied to a function block included in said integrated logic circuit and a train of logic values of an output signal delivered from said function block both by the use of a contactless probing device;
   carrying out logic simulation preset for normal operation of said function block, by using said detected train of logical values of said input signal as its input data; and
   comparing a train of logical values of an output signal derived as a result of said logic simulation with said train of logical values of said output signal derived by the use of said contactless probing device, and determining that the function block is faulty when the comparison results in non-coincidence.

2. A method of diagnosing an integrated logic circuit, comprising the steps of:
   (a) detecting a train of logical values of an output signal appearing at a predetermined measuring point within said integrated logic circuit by the use of a contactless probing device;
   (b) detecting a faulty signal by comparing a train of logical values of an expected output signal, at said predetermined measuring point, derived by logic simulation of said integrated logic circuit, with said detected train of logical values of said output signal;
   (c) finding an input signal supplied to a function block delivering said faulty signal, by referring to a file of logic connection information;
   (d) positioning a measuring point at a location of said found input signal;
   (e) detecting a train of logical values of a signal at said location by use of said contactless probing device;
   (f) detecting another faulty signal by comparing a train of logical values of an expected signal, at said location, derived by logic simulation, with said detected train of logical values of said signal;
   (g) finding a function block whose output signal is faulty and whose input signal is not faulty by repeating steps (c)-(f); and
   (h) determining that said detected function block is faulty.

3. A method of diagnosing an integrated logic circuit having a plurality of function blocks capable of performing logic functions, comprising the steps of:
   supplying a test signal to said logic circuit;
   detecting a train of logical values of an input signal supplied to one of said function blocks and a train of logical values of an output signal delivered from said one function block both by the use of a contactless probing device;
   carrying out simulation of a normal logical operation of said one function block with said detected train of logical values of said input signal to provide a simulated output signal related to said detected train of logical values of said input signal;
   comparing said detected train of logical values of said output signal with said simulated output signal; and
   determining that said one function block is normal or abnormal when said comparison results in coincidence or non-coincidence.

4. A method of diagnosing an integrated logic circuit having a plurality of function blocks capable of performing logic functions, at least one of the function blocks including plural function elements, the method comprising the steps of:
   (a) carrying out simulation of a normal logical operation of at least one of said function blocks with a test signal to provide simulated output signals of at least one of the function elements of said one function block related to said test signal, said simulated output signals including a simulated output signal of said one function block;
   (b) supplying said test signal to said logic circuit;
   (c) detecting a train of logic values of an output signal of said one function block by the use of a contactless probing device;
   (d) comparing said detected train of logical values of said output signal with said simulated output signal of said one function block to determine that said one function block is faulty when the comparison results in non-coincidence;
   (e) retrieving, in a file carrying logic connection information concerning said one function block, that input signal responsive to which said non-coincidence is produced by a function element in said one function block;
   (f) detecting, by the use of said contactless probing device a train of logical values of a signal on that point within said one function block to which the retrieved input signal is to be supplied;
   (g) comparing said detected train of logical values of said signal on said point with that one of said simulated output signal which corresponds to said detected train of logical values of said signal on said point to determine that said function element receives a false input signal when the comparison results in non-coincidence;
   (h) repeating steps (e)-(g) with respect to other function elements in said one function block until the comparison between the detected and simulated signals results in coincidence; and
   (i) determining that the function element related to a detected train of logical values of a signal and a corresponding simulated signal which coincide with each other is faulty.

5. A method of diagnosing an integrated logic circuit having a plurality of function blocks capable of performing logic functions, at least one of the function blocks including plural function elements, the method comprising the steps of:
   (a) carrying out simulation of a normal logic operation of at least one of said function blocks with a test signal to provide simulated output signals in said at least one function block and a simulated output signal of said logic circuit related to said test signal;

(b) supplying said test signal to said logic circuit;

(c) detecting an output signal of said logic circuit;

(d) comparing said detected output signal with said simulated output signal of said logic circuit to determine that said logic circuit is faulty when the comparison results in non-coincidence;

(e) electing one of said function blocks to be measured;

(f) detecting, by use of a contactless probing device a train of logical values of an input signal to an d a train of logical values of an output signal from said elected function block;

(g) comparing said detected train of logical values of said input signals and said detected train of logical values of said output signal with those simulated signals prepared in step (a) which correspond to said detected train of logical values of said input and output signals to determine that said elected function block is faulty when the comparisons concerning both of said detected train of logical values of said input and output signals result in non-coincidence;

(h) carrying out simulation of a normal logic operation of said elected function block with said detected train of logical values of said input signal in step (f) to provide a simulated output signal related to said detected train of logical values of said input signal in step (f);

(i) comparing said detected train of logical values of said output signal in step (f) with said simulated output signal prepared in step (h) to determine that said elected function block is faulty when the comparison results in non-coincidence is produced by a function element in said function block;

(j) retrieving, in a file carrying logic connection information concerning said elected function block, that input signal responsive to which said non-coincidence is produced by a function element in said function block;

(k) detecting, by the use of said contactless probing device, a train of logical values of a signal on that point within said elected function block where said retrieved input signal is to be supplied to said function element;

(l) comparing said detected train of logical values of said output signal in step (k) with that one of said simulated output signals prepared in step (a) which correspond to said detected train of logical values of said signal;

(m) determining that said function element is faulty when said comparison in step (l) results in coincidence; and (n) when the comparison in step (1) results in non-coincidence, repeating steps (j)–(m) with respect to other function elements in said elected function block until the comparison between a detected train of logical values of a signal and a corresponding simulated signal results in coincidence.

6. A method of diagnosing an integrated logic circuit, comprising the steps of:

(a) detecting an output signal appearing at an output terminal of an integrated logic circuit by the use of an LSI testing equipment;

(b) detecting a faulty signal by comparing a train of logical values of an expected output signal, at said output terminal, derived by logic simulation of said integrated logic circuit, with said detected train of logical values of said output signal;

(c) finding an input signal supplied to a function block delivering said faulty signal, by referring to a file of logic connection information;

(d) positioning a measuring point at a location of said found input signal;

(e) detecting a train of logical values of signal at said location by use of a contactless probing device;

(f) detecting another faulty signal by comparing a train of logical values of an expected signal, at said location, derived by logic simulation, with said detected train of logical values of said signal;

(g) finding a function block whose output signal is faulty and whose input signal is not faulty by repeating steps (c)–(f); and (h) determining that said detected function block is faulty.

* * * * *